United States Patent [19]
Chao et al.

[11] Patent Number: 5,141,791
[45] Date of Patent: Aug. 25, 1992

[54] CURABLE POLYPHENYLENE ETHER-POLYEPOXIDE COMPOSITIONS FROM MELT PROCESSED POLYPHENYLENE ETHERS, AND LAMINATES PREPARED THEREFROM

[75] Inventors: Herbert S. Chao, Schenectady; Jana M. Whalen, Clifton Park, both of N.Y.

[73] Assignee: General Electric Company, Schenectady, N.Y.

[21] Appl. No.: 544,572

[22] Filed: Jun. 27, 1990

Related U.S. Application Data

[62] Division of Ser. No. 255,558, Oct. 11, 1988, Pat. No. 5,001,010.

[51] Int. Cl.⁵ .................. B32B 15/08; B32B 17/10
[52] U.S. Cl. ............................ 428/209; 428/210; 428/285; 428/413; 428/418; 428/901
[58] Field of Search ............... 428/418, 285, 901, 209, 428/210, 413

[56] References Cited

U.S. PATENT DOCUMENTS 3,375,298  3/1968  Fox .
4,853,423  8/1989  Walles et al. .
4,975,319  12/1990  Walles et al. .................. 428/901

FOREIGN PATENT DOCUMENTS 219217  12/1983  Japan .
8700850  2/1987  PCT Int'l Appl. .

Primary Examiner—Jacob Ziegler
Attorney, Agent, or Firm—William H. Pittman; James C. Davis, Jr.

[57] ABSTRACT

Compositions comprising a polyepoxy compound (preferably bisphenol A diglycidyl ether) and a polyphenylene ether which has been melt processed (e.g., by extrusion) at a temperature in the range of about 230°–390° C., are cured at temperatures in the range of about 190°–250° C. by various epoxy cure catalysts. They may used in the preparation of laminates with excellent dielectric properties, solvent resistance and solder resistance, useful in printed circuit board production.

13 Claims, No Drawings

CURABLE POLYPHENYLENE ETHER-POLYEPOXIDE COMPOSITIONS FROM MELT PROCESSED POLYPHENYLENE ETHERS, AND LAMINATES PREPARED THEREFROM

This application is a division, of application Ser. No. 255,558, filed Oct. 11, 1988, now U.S. Pat. No. 5,001,010.

This invention relates to the chemistry of polyphenylene ether-polyepoxide compositions, and more particularly to the improvement of solvent resistance and solderability in cured composites prepared from such compositions.

A number of polyphenylene ether-polyepoxide compositions are known. Many of such compositions, generally in the form of fiber-reinforced prepregs (i.e., substrates impregnated with uncured or partially cured resins), undergo cure to form materials with high dielectric constants and other properties favorable for their use, for example, as copper-clad laminates suitable for etching to form printed circuit boards. Copending, commonly owned application Ser. No. 92,725, filed Sep. 3, 1987, discloses a class of such compositions which are curable by a zinc or aluminum salt of a diketone such as acetylacetone, optionally in the presence of a phenolic compound or basic nitrogen compound as a curing accelerator. The products are excellent for use in circuit board laminates.

The polyphenylene ethers useful in the preparation of polyphenylene ether-polyepoxide compositions comprise a plurality of structural units having the formula

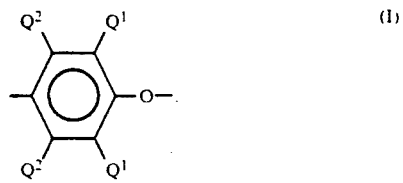

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen. Suitable polyphenylene ethers are disclosed in a large number of patents.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl-1,4-phenylene ether units. Many suitable random copolymers, as well as homopolymers, are disclosed in the patent literature.

Also included are polyphenylene ethers containing moieties which modify properties such as molecular weight, melt viscosity and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles and formals.

For the purposes of this invention, the polyphenylene ether initially has a number average molecular weight within the range of about 3,000–40,000, preferably at least about 12,000 and most preferably at least about 15,000, and a weight average molecular weight within the range of about 20,000–80,000, as determined by gel permeation chromatography. Its intrinsic viscosity is most often in the range of about 0.35–0.6 dl./g., as measured in chloroform at 25° C.

The polyphenylene ethers are typically prepared by the oxidative coupling of at least one corresponding monohydroxyaromatic compound. Particularly useful and readily available monohydroxyaromatic compounds are 2,6-xylenol (wherein each $Q^1$ is methyl and each $Q^2$ is hydrogen), whereupon the polymer may be characterized as a poly(2,6-dimethyl-1,4-phenylene ether), and 2,3,6-trimethylphenol (wherein each $Q^1$ and one $Q^2$ is methyl and the other $Q^2$ is hydrogen).

A variety of catalyst systems are known for the preparation of polyphenylene ethers by oxidative coupling. There is no particular limitation as to catalyst choice and any of the known catalysts can be used. For the most part, they contain at least one heavy metal compound such as a copper, manganese or cobalt compound, usually in combination with various other materials.

A first class of catalyst systems, often preferred, consists of those containing a copper compound. Such catalysts are disclosed, for example, in U.S. Pat. Nos. 3,306,874, 3,306,875, 3,914,266 and 4,028,341. They are usually combinations of cuprous or cupric ions, halide (i.e., chloride, bromide or iodide) ions and at least one amine.

Catalyst systems containing manganese compounds constitute a second class. They are generally alkaline systems in which divalent manganese is combined with such anions as halide, alkoxide or phenoxide. Most often, the manganese is present as a complex with one or more complexing and/or chelating agents such as dialkylamines, alkanolamines, alkylenediamines, o-hydroxyaromatic aldehydes, o-hydroxyazo compounds, ω-hydroxyoximes (monomeric and polymeric), o-hydroxyaryl oximes and β-diketones. Also useful are known cobalt-containing catalyst systems. Suitable manganese and cobalt-containing catalyst systems for polyphenylene ether preparation are known in the art by reason of disclosure in numerous patents and publications.

Certain commercially available polyphenylene ethers comprise molecules having at least one of the end groups of the formulas

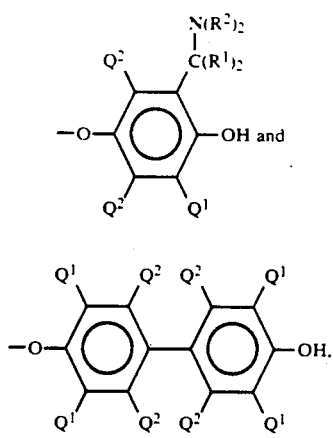

(II)

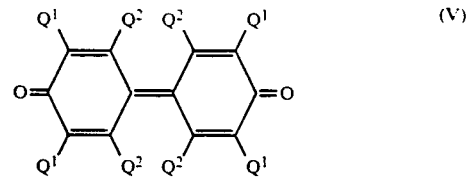

(V)

(III)

wherein $Q^1$ and $Q^2$ are as previously defined; each $R^1$ is independently hydrogen or alkyl, with the proviso that the total number of carbon atoms in both $R^1$ radicals is 6 or less; and each $R^2$ is independently hydrogen or a $C_{1-6}$ primary alkyl radical. Preferably, each $R^1$ is hydrogen and each $R^2$ is alkyl, especially methyl or n-butyl.

Polymers containing the aminoalkyl-substituted end groups of formula II may be obtained by incorporating an appropriate primary or secondary monoamine as one of the constituents of the oxidative coupling reaction mixture, especially when a copper- or manganese-containing catalyst is used. Such amines, especially the dialkylamines and preferably di-n-butylamine and dimethylamine, frequently become chemically bound to the polyphenylene ether, most often by replacing one of the α-hydrogen atoms on one or more $Q^1$ radicals. The principal site of reaction is the $Q^1$ radical adjacent to the hydroxy group on the terminal unit of the polymer chain. During further processing and/or blending, the aminoalkyl-substituted end groups may undergo various reactions, probably involving a quinone methide-type intermediate of the formula

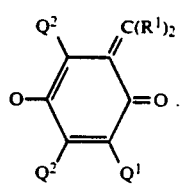

(IV)

Reference is made to U.S. Pat. Nos. 4,054,553, 4,092,294, 4,477,649, 4,477,651 and 4,517,341, the disclosures of which are incorporated by reference herein.

Polymers with 4-hydroxybiphenyl end groups of formula III are typically obtained from reaction mixtures in which a by-product diphenoquinone of the formula is present, especially in a copper-halide-secondary or tertiary amine system. In this regard, the disclosure of U.S. Pat. No. 4,477,649 is again pertinent as are those of U.S. Pat. Nos. 4,234,706 and 4,482,697, which are also incorporated by reference herein. In mixtures of this type, the diphenoquinone is ultimately incorporated into the polymer in substantial proportions, largely as an end group.

In many polyphenylene ethers obtained under the above-described conditions, a substantial proportion of the polymer molecules, typically constituting as much as about 90% by weight of the polymer, contain end groups having one or frequently both of formulas II and III. While polyphenylene ethers of this type are very useful for the formation of cured polyphenylene ether-polyepoxide compositions, cured products prepared therefrom are somewhat deficient in areas such as solderability and resistance to solvents, especially methylene chloride which is frequently used to clean circuit boards. The present invention is based on the discovery that these properties can be substantially improved by subjecting the polyphenylene ether to a melt processing step prior to the preparation of the polyphenylene ether-polyepoxide composition.

Accordingly, one aspect of the present invention is curable compositions comprising:

(A) a polymer prepared by melt processing, at a temperature in the range of about 230°–390° C., at least one polyphenylene ether containing a substantial proportion of aminoalkyl-substituted end groups of formula (II);

(B) at least one polyepoxy compound; and (C) an epoxy cure catalyst.

Reagent A in the compositions of this invention is prepared from a polyphenylene ether of the type described hereinabove, which contains a substantial proportion of end groups of formula II. Said polyphenylene ether is melt processed by any of such operations of extrusion, rolling, kneading or calendering, most often extrusion, at a temperature in the range of about 230°–390° C. and preferably about 250°–325° C.

The extrusion operation may be performed under atmospheric pressure conditions or with vacuum venting. The choice of extrusion pressure is not critical to the present invention, since vacuum venting is not believed to confer any benefit on the product. However, certain commerically employed processes for polyphenylene ether preparation and handling include extrusion with vacuum venting, and they may be utilized without adverse effect.

Reagent B is at least one polyepoxy compound. In its broadest sense, the invention includes the use of any of such compounds known in the art. The following are illustrative.

(1) Polyglycidyl ethers of bisphenols, especially bisphenol A. These include compounds of the formula

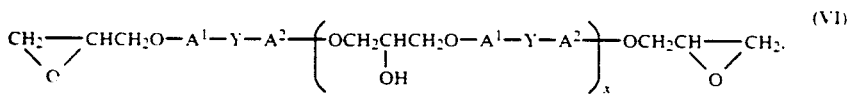

(VI)

wherein each of $A^1$ and $A^2$ is a monocyclic divalent aromatic radical. Y is a bridging radical in which one or two carbon atoms separate $A^1$ from $A^2$ and x has an average value from 0 to about 15.

(2) Epoxy novolaks of the formula

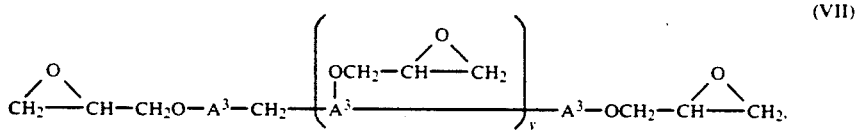

(VII)

wherein each $A^3$ is an aromatic radical and y has an average value of at least about 0.1.

(3) Glycidyl adducts of amines and amides, illustrated by N,N-diglycidylaniline, N,N,N',N'-tetraglycidylxylylenediamine and triglycidyl isocyanurate.

(4) Glycidyl esters of carboxylic acids, such as diglycidyl phthalate and diglycidyl adipate.

(5) Polymers of unsaturated epoxides such as glycidyl acrylate, glycidyl methacrylate and allyl glycidyl ether.

(6) Polysiloxanes containing epoxy functionality, such as the diglycidyl ether of 1,3-bis(3-hydroxypropyl)tetramethyldisiloxane.

(7) Compounds prepared by epoxidation of dienes or polyenes, such as bis(2,3-epoxycyclopentyl) ether and vinylcyclohexene dioxide.

The preferred polyepoxy compounds for the purposes of this invention are the polyglycidyl ethers of bisphenols (having formula VI), especially of bisphenol A, most especially those in which x has an average value up to 1. They may be used alone or in combination with minor amounts of at least one of non-bisphenolic polyepoxy compounds, illustrated by alicyclic polyepoxy compounds such as 3,4-epoxycyclohexylmethyl 3,4-epoxycyclohexanecarboxylate, vinylcyclohexene dioxide, phenol-formaldehyde novolak polyglycidyl ethers corresponding to formula VII, resorcinol glycidyl ether, tetrakis(glycidyloxyphenyl)ethane, diglycidyl phthalate, diglycidyl tetrahydrophthalate and diglycidyl hexahydrophthalate. Epoxy novolaks of formula VII are often preferred. Also present may be aryl monoglycidyl ethers such as the phenyl, α-naphthyl and β-naphthyl ethers and substituted derivatives thereof. When present, such non-bisphenol polyepoxy compounds and aryl monoglycidyl ethers will usually constitute up to about 30% by weight of total epoxy compounds.

For the most part, component B will contain a total of no more than about 30% by weight of components B-2 and/or B-3, if any. The mixture of components A and B typically contains component A in proportions in the range of 5-90% by weight, with about 30-85% and particularly about 60-80% being preferred.

A specific class of polyepoxy compounds contemplated for use in the invention consists of reaction products obtained by heating, in the presence of a catalytic amount of at least one basic reagent, a mixture comprising:

(1) at least one halogen-free bisphenol polyglycidyl ether having an average of at most one aliphatic hydroxy group per molecule;

(2) about 15-25% of at least one halogen-free epoxidized novolak; and (3) 25-35% of at least one bisphenol containing bromine as aryl substituents;

the percentages of components 2 and 3 being based on total reagents 1, 2 and 3. Such products are disclosed and claimed in copending, commonly owned application Ser. No. 219,102, filed Jul. 14, 1988, the disclosure of which is incorporated by reference herein. The following example is illustrative of the preparation of such compositions.

EXAMPLE 1

A mixture of 50 parts by weight of bisphenol A diglycidyl ether, 30 parts of 2,2-bis(3,5-dibromo-4-hydroxyphenyl)propane, 20 parts of an epoxy novolak resin commercially available from Ciba-Geigy under the grade designation "EPN 1138" and 0.2 part of triphenylphosphine was heated at 165° C. for one hour in a nitrogen atmosphere, with stirring. The product was the desired composition and contained 17.6% bromine.

Reagent C is an epoxy cure catalyst. Many types of such catalysts are known, and any of them may be used according to the present invention. They include metal salts of diketones such as aluminum tris(acetylacetonate) and zinc bis(acetylacetonate); diaryliodonium salts such as the tetrafluoborates, hexafluophosphates, hexafluoarsenates and hexafluoantimonates; ultraviolet-activated triarylsulfonium salts containing the same anions; imidazoles such as imidazole, 1,2-dimethylimidazole, 2-methylimidazole, 2-heptadecylimidazole and 1-(2-cyanoethyl)-2-phenylimidazole; arylene polyamides, preferably having a high degree of alkyl substitution on the aromatic ring, illustrated by the diethylmethyl-substituted m- and p-phenylenediamines, and mixtures thereof with the aforementioned imidazoles; and numerous other species known in the art. The metal acetylacetonates, and particularly those of zinc and aluminum, are generally preferred.

Various other materials may also be present in the curable compositions of this invention. For example, curing accelerators may be employed. They include phenolic compounds such as bisphenol A, pyrogallol, dihydroxydiphenyls, hydroxybenzaldehydes such as salicylaldehyde, catechol, resorcinol, hydroquinone, phenol-formaldehyde or resorcinol-formaldehyde condensates and halogenated phenols.

Also useful, and usually preferred, as curing accelerators are basic nitrogen compounds, particularly amines and guanidines. Their precise identity is not critical, provided they have sufficiently low volatility to remain present and active in the composition during the curing operation. Particularly effective are $C_{4-10}$ alkylamines such as di-n-butylamine, tri-n-butylamine and 2-ethylhexylamine, and tetraalkylguanidines such as tetramethylguanidine which are generally preferred. Polyphenylene ethers containing aminoalkyl-substituted end groups of formula II, and to some extent the free amines generated thereby in the formation of quinone methide-type intermediates of formula IV, may also act as accelerators.

The curable compositions of this invention typically contain the curing catalyst (component C) in small quantities, ordinarily about 0.5–10.0% and preferably about 1–5% based on the total of components A and B. When an amine or guanidine is employed as an accelerator, it is ordinarily utilized in an amount to provide about 1000–1500 ppm., based on the total of the accelerator and reagents A, B and C, of basic, non-volatilized nitrogen. The amount of said accelerator added will therefore be adjusted downward to compensate for the basic nitrogen, if any, present in the polyphenylene ether, which is usually in the range of about 200–1000 ppm., and upward to compensate for volatilization. Balancing these factors, an amount of accelerator to provide about 1500–2500 ppm. of basic nitrogen is usually appropriate.

The reasons for the improved properties of poly-phenylene ether-polyepoxide compositions prepared from melt processed polyphenylene ethers, in accordance with the present invention, are not fully understood. It is belived, however, that the phenolic hydroxy gorup ortho to an aminoalkyl substituent is inactivated to a certain extent by hydrogen bonding with the amino group. Elimination of the amino group forms a quinone methide intermediate as described hereinabove; said intermediate is believed to be capable of undergoing further reaction to generate a nonhydrogen bonded phenolic hydroxy group which is more active than one which is hydrogen bonded, and thus more reactive with the polyepoxide.

This belief is confirmed by the infrared spectra of the melt processed polyphenylene ethers and those that have not been melt processed. In the latter, the aromatic OH band is wide, indicating some type of interaction such as hydrogen bonding. In the former, said band is sharp as would be expected of a hydroxy group free from such interactions.

Also present in the curable compositions may be materials such as hardeners, illustrated by phenols of both low and relatively high molecular weight, the latter being exemplified by novolak resins; flame retardants, such as hydrated alumina, decabromodiphenyl ether)s and bromine compounds which may be of low or high molecular weight (the latter type illustrated by the product of Example 3); flame retardant synergists such as antimony pentoxide; antioxidants, thermal and ultraviolet stabilizers, lubricants, anti-static agents, dyes, pigments and the like, all in conventional proportions.

For the formation of prepregs, the curable compositions of the invention are typically dissolved in an effective amount of an inert organic solvent, typically to a solute content of about 15–60% by weight. The identity of the solvent is not critical, provided it may be removed by suitable means as evaporation. Aromatic hydrocarbons, especially toluene, are preferred.

Another aspect of the invention is curable articles comprising a fibrous substrate (woven or non-woven) such as glass, quartz, polyester, polyamide, polypropylene, cellulose, nylon or acrylic fibers, preferably glass, impregnated with the curable compositions of this invention and typically obtained upon removal of the solvent therefrom by evaporation or the like. Such articles (i.e., prepregs) may be cured by application of heat, and the resulting cured articles are still other aspects of the invention.

Typically, 2- to 20-ply prepreg laminates are compression molded at temperatures in the range of about 190°–250° C. and under pressures on the order of 20–60 kg./cm.$^2$. Laminates clad with a conductive metal such as copper, useful for printed circuit board production, may be so prepared and cured by art-recognized methods. Printed circuit board blanks comprising said laminates are characterized by excellent physical dielectric properties. The metal cladding may then be conventionally patterned.

The precise chemical nature of the cured compositions of the invention is not known with certainty, although curing of the epoxy compound probably takes place conventionally, at least in part. It is believed that reagent A participates in the curing reaction, probably at least in part through the carboxylic acid or anhydride groups.

The preparation of the curable and cured compositions of this invention is illustrated by the following examples.

EXAMPLE 2

A melt processed polyphenylene ether was prepared by extruding on a twin screw extruder, within the temperature range of about 300°–315° C. and with vacuum venting to a maximum pressure of 20 torr, a poly(2,6-dimethyl-1,4-phenylene ether) having a number average molecular weight of about 20,000 and an intrinsic viscosity in chloroform at 25° C. of 0.46 dl./g., said polyphenylene ether having been prepared by oxidative coupling of 2,6-xylenol in the presence of a copper-bromine-amine catalyst containing di-n-butylamine.

A solution of 630 grams of the melt processed polyphenylene ether, 270 grams of bisphenol A diglycidyl ether, 27 grams of aluminum tris(acetylacetonate) and 5 grams of tetramethylguanidine in 2500 ml. of hot toluene was prepared. Glass cloth was passed through the solution at 55° C. and 25.4 cm. per minute and the impregnated cloth was dried at about 150° C., to yield a prepreg material in which the resin content was about 50%. A cured laminate was prepared therefrom by compression molding of ten sheets of prepreg at 240° C. for 50 minutes.

The laminate was tested for solvent resistance by submerging in methylene chloride for 30 minutes, drying in air for 10 minutes and measuring the percentage weight gain, ant then testing overnight at 100° C. and measuring percentage weight loss. It was tested for solder resistance by dipping into a solder bath at 280°–285° C. for 30 seconds and measuring the percentage increase in laminate thickness.

EXAMPLE 3

The procedure of Example 2 was repeated, substituting 90 parts of "EPN 1138" for an equal amount of bisphenol A diglycidyl ether.

The results are given in the following table, in comparison with two controls prepared from untreated polyphenylene ether: Control A corresponding to the product of Example 2, and Control B corresponding to that of Example 3.

|  | Example 2 | Control A | Example 3 | Control B |
|---|---|---|---|---|
| Tg, °C | 203 | 187, 223 | — | — |
| Solvent resistance: |  |  |  |  |
| % weight gain | 4.5 | 9 | 5.2 | 5.9 |
| % weight loss | 0 | 3 | 0 | 2.4 |
| Solder resistance, % thickness increase | 0 | 13 | 0 | 8.8 |

These results clearly show the improvement in solvent resistance and solder resistance afforded according to the present invention.

What is claimed is:

1. A printed circuit board blank prepared by the application of heat to a curable article comprising a fibrous substrate impregnated with a curable composition comprising:

(A) a polymer prepared by melt processing, at a temperature in the range of about 230°-390° C., at least one polyphenylene ether containing a substantial proportion of aminoalkyl-substituted end groups of the formula

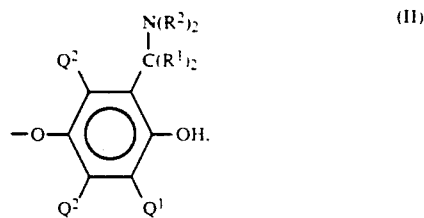

wherein:
   $Q^1$ is halogen, primary or secondary lower alkyl, phenyl, haloalkyl, aminoalkyl, hydrocarbonoxy, or halohydrocarbonoxy wherein at least two carbon atoms separate the halogen and oxygen atoms;
   each $Q^2$ is independently hydrogen, halogen, primary or secondary lower alkyl, phenyl, haloalkyl, hydrocarbonoxy or halohydrocarbonoxy as defined for $Q^1$;
   each $R^1$ is independently hydrogen or alkyl, with the proviso that the total number of carbon atoms in both $R^1$ radicals is 6 or less; and
   each $R^2$ is independently hydrogen or a $C_{1-6}$ primary alkyl radical;
   (B) at least one polyepoxy compound; and
   (C) an epoxy cure catalyst.

2. A printed circuit board blank according to claim 1 wherein each $R^1$ is hydrogen and each $R^2$ is methyl or n-butyl.

3. A printed circuit board blank according to claim 2 wherein the polyphenylene ether used to prepare reagent A has a number average molecular weight of at least about 12,000.

4. A printed circuit board blank according to claim 3 wherein reagent B is selected from the group consisting of at least one polyglycidyl ether of a bisphenolic compound, said polyglycidyl ether having the formula

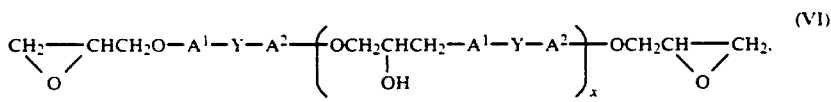

wherein each of $A^1$ and $A^2$ is a monocyclic divalent aromatic radical, Y is bridging radical in which one or two atoms separate $A^1$ from $A^2$ and x has an average value up to 1; and combinations of a major amount of said polyglycidyl ether with a minor amount of at least one of aryl monoglycidyl ethers and non-bisphenolic polyepoxy compounds.

5. A printed circuit board blank according to claim 4 wherein the polyphenylene ether used to prepare reagent A is a poly(2,6-dimethyl-1,4-phenylene ether) having a number average molecular weight in the range of about 15,000–40,000, and reagent A comprises about 30–85% by weight, based on reagents A and B.

6. A printed circuit board blank according to claim 5 wherein the substrate is glass fiber.

7. A printed circuit board blank according to claim 5 wherein the metal is copper.

8. A printed circuit board blank according to claim 5 wherein said curable composition comprises up to about 90% by weight of reagent A, based on reagents A and B, and wherein the polyphenylene ether is melt processed by extrusion at a temperature in the range of about 250°–325° C.

9. A printed circuit board blank according to claim 6 wherein reagent B consists essentially of said polyglycidyl ether of a bisphenolic compound.

10. A printed circuit board blank according to claim 9 wherein each of $A^1$ and $A^2$ are p-phenylene, Y is isopropylidene and x is 0.

11. A printed circuit board blank according to claim 10 wherein said curable composition also includes at least one phenolic compound or basic nitrogen compound as a curing accelerator.

12. A printed circuit board blank according to claim 11 wherein the accelerator is a basic nitrogen compound and is present in an amount to provide about 1000–1500 ppm., based on the total of the accelerator and reagents A, B and C, of basic, non-volatilized nitrogen.

13. A printed circuit board blank according to claim 11 wherein the accelerator is tetramethylguanidine and is present in the amount of about 1500–2500 ppm., based on the total of the accelerator and reagents B, B and C.

* * * * *